United States Patent [19]

Powel

[11] Patent Number: 4,593,813

[45] Date of Patent: Jun. 10, 1986

[54] PROTECTIVE CONTAINER FOR ASSEMBLED PRINTED CIRCUIT BOARDS

[76] Inventor: Stephen S. Powel, 4305 Tallwood Dr., Greensboro, N.C. 27410

[21] Appl. No.: 721,051

[22] Filed: Apr. 8, 1985

[51] Int. Cl.[4] .............................................. B65D 73/02
[52] U.S. Cl. .................................... 206/328; 206/334; 206/583; 206/453; 220/4 B; 220/307; 220/324
[58] Field of Search ............... 206/328, 334, 483, 449, 206/453; 220/4 G, 4 B, 307, 324; 211/40

[56] References Cited

U.S. PATENT DOCUMENTS

| | | | |
|---|---|---|---|
| 3,256,975 | 7/1966 | Puente | 206/328 |
| 3,482,895 | 12/1969 | Becklin | 206/328 |
| 3,615,006 | 10/1971 | Freed | 206/328 |
| 3,672,495 | 6/1972 | Bauer et al. | 206/328 |
| 4,533,976 | 8/1985 | Suwa | 206/328 |

*Primary Examiner*—Joseh Man-Fu Moy
*Attorney, Agent, or Firm*—Charles R. Rhodes; Judith E. Garmon

[57] ABSTRACT

A pair of identically formed, U-shaped housing halves formed of a conductive polymeric material are snapped together to form a rectangular body open at the front and rear with a top, bottom and side walls and which establishes an effective Faraday Cage. Nesting pads on the top and bottom walls provide for stacking multiple housings, one atop the other. A plurality of parallel, non-continuous tracks extend from front to rear of the body and support a pair of horizontally spaced, upstanding circuit board mounting partitions therein. Each partition includes a vertical wall having a longitudinal axis offset from the corresponding axis of supporting track and longitudinally extending channels on the opposite surfaces thereof of receiving one edge of the printed circuit board and supporting the printed circuit board horizontally between such partition and the other partition of the pair. A hinged door is provided to selectively cover the front and rear openings allowing access to the contents thereof for removal, testing, or the like while the containers remain stacked, without disturbing the Faraday Cage. The U-shaped housing halves may be separated and connected by side inserts to increase the height dimension thereof.

21 Claims, 9 Drawing Figures

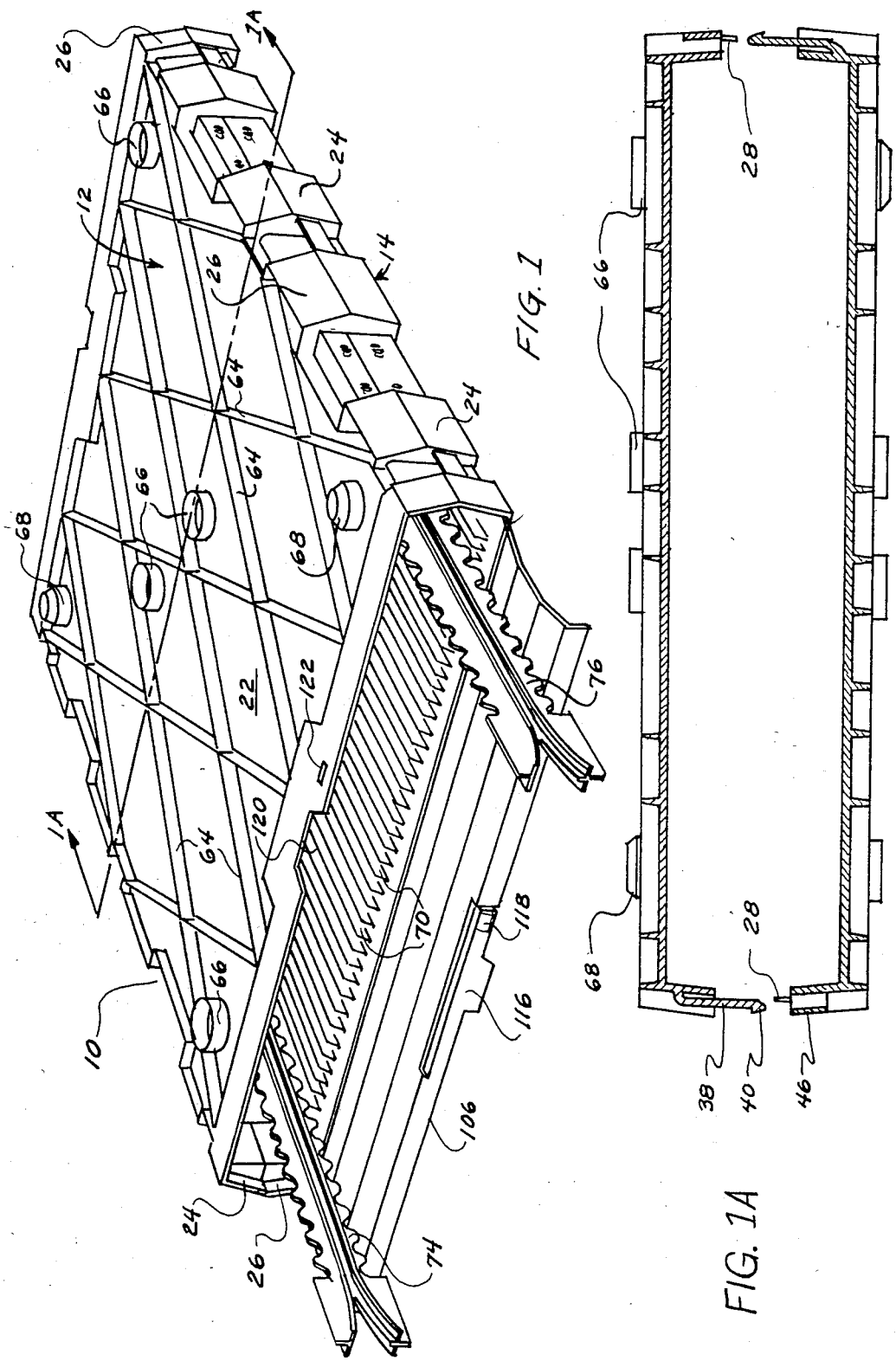

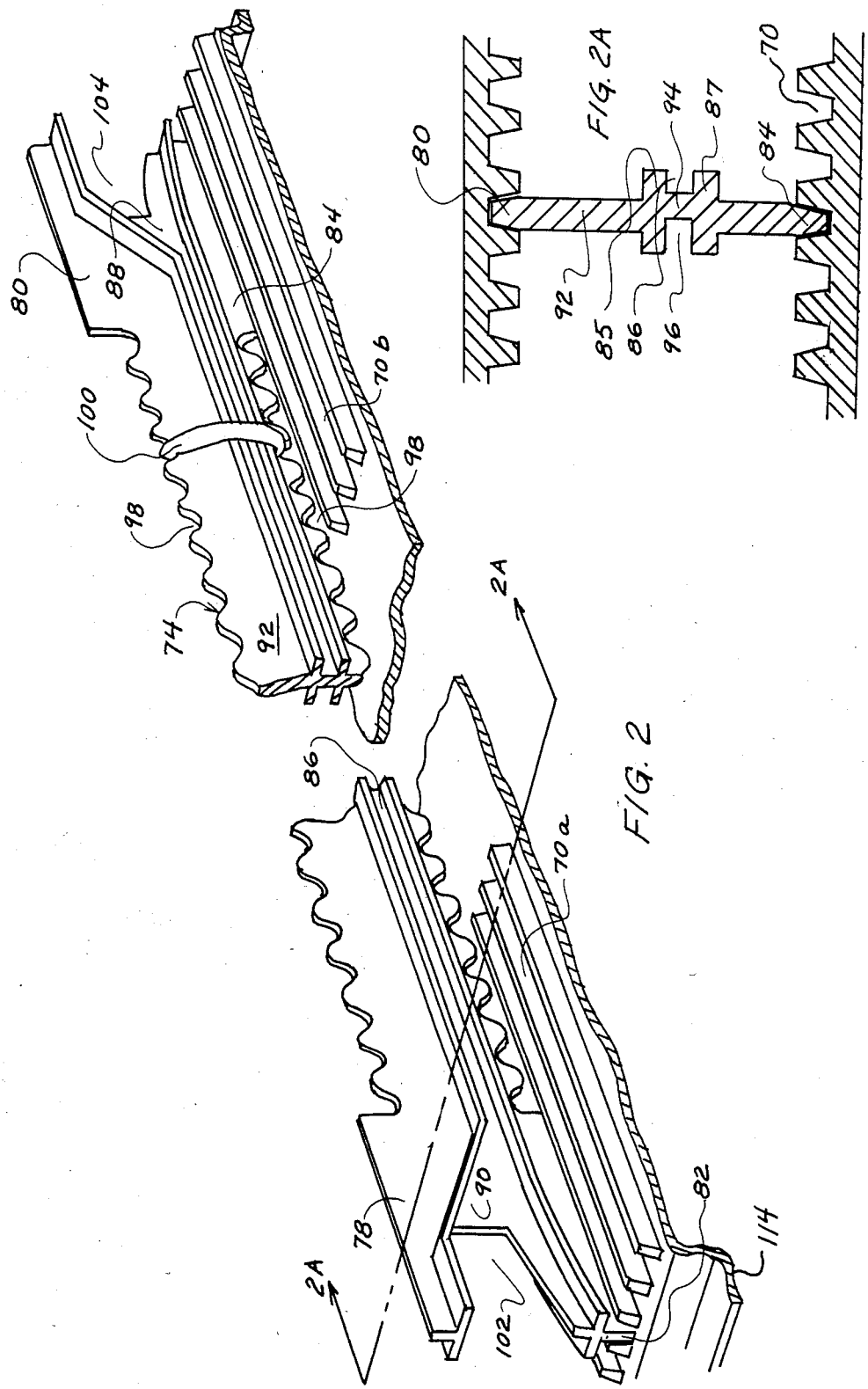

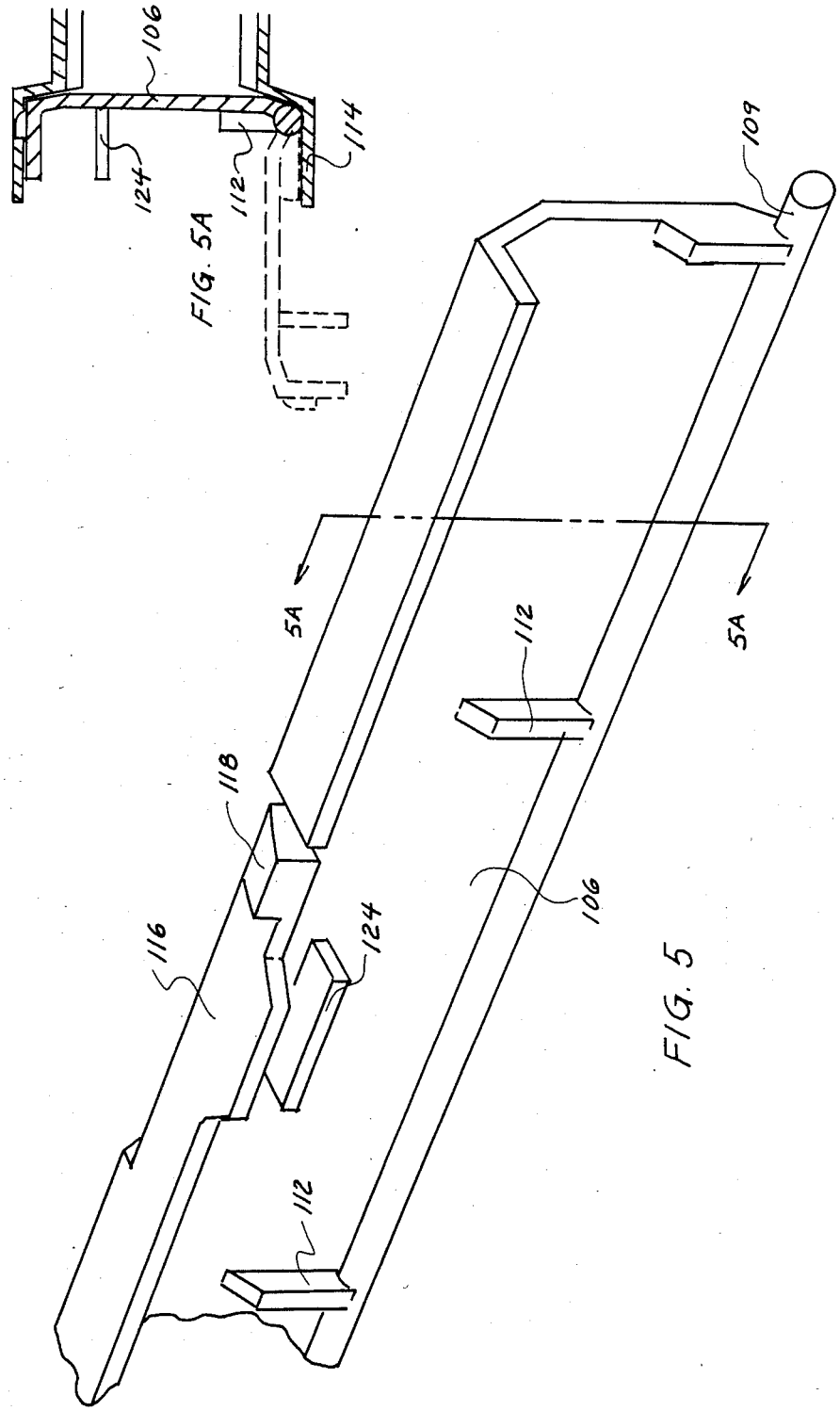

PROTECTIVE CONTAINER FOR ASSEMBLED PRINTED CIRCUIT BOARDS

BACKGROUND OF THE PRESENT INVENTION

This invention relates to a protective container for printed circuit boards, and particularly to such a container in which the printed circuit boards are securely held during handling, storage, testing, shipping, as well as providing a field service container. Additionally at all times the printed circuit boards are surrounded by a Faraday Cage.

In recent years as tremendous progress has been made in the field of micro-electronics, it has become possible to miniaturize electronics increasingly through the use of integrated circuits. Such miniaturization permits more and more components to be mounted on printed circuit boards, which components utilize very small voltages. While such developments have been significant in the generation of numerous new products, certain problems have arisen which were essentially unknown in earlier electronic production practices.

One of these problem areas has been the effect of static electricity and the damage it can cause on sensitive electronic components. Static electricity is a phenomenon that occurs quite naturally and quite often in relatively dry environments through the normal activities of employees who are handling sensitive equipment. For example, static charges of a significant magnitude, enough to damage or destroy certain sensitive micro-electronic components can be generated by an individual walking across a floor, then touching sensitive equipment. At such times the charge is transferred from the person's hand to the circuitry. Further, the damage may occur without any indication thereof until the circuit is mounted into its operative environment and tested.

Thus, considerable effort has been undertaken to prevent such damage. It is now known that once such sensitive components are assembled onto a printed circuit board, the printed circuit board should remain protected, as much as possible, within a Faraday Cage. A Faraday Cage is generally a container formed of a conductive polymeric material which surrounds and isolates the sensitive equipment from such charges.

Printed circuit boards are made in a variety of sizes, but are generally rectangular. During manufacture, printed circuit boards undergo several separate operations. First, the circuit pattern is etched and printed on one or both sides of a carrier or substrate. Next, components are mounted in holes therein either by automatic insertion or by hand. The components are subsequently secured in place by a soldering technique such as wave or vapor soldering, and later the boards may be assembled into a panel, drawer, or the like with other similar printed circuit boards or electrical components. At various stages of this manufacturing process, the printed circuit boards must be stored or transported to another manufacturing area. Once the sensitive components are inserted onto the boards, the boards must thereafter be protected from static charges, as well as being protected from physical damage. All of these procedures require multiple handlings between the operative steps.

After the components are initially mounted on the printed circuit boards and before they are soldered, there is generally some handling and storage necessary. After wave soldering, the boards must be somehow suspended in an air path for drying. Once the assembly and soldering operations have been completed, there is generally a testing procedure conducted. The boards are then stored or shipped to the field, and often in the field must be stored for a period of time before utilization in some type of larger assembly. During all of these operations it is important that the sensitive components on the printed circuit boards be protected from electrostatic charges. Thus during such storage and handling operations, the less the boards have to be removed, the better.

Early approaches to this problem resulted in the printed circuit boards being wrapped in some type of high surface resistant, groundable bags or wrappers. Later, cartons or boxes were developed in which the surfaces thereof were coated with an electrically conductive material. Handling trays and shipping cartons formed of a metallic or electrically conductive polymeric material have now been developed in which the printed circuit boards are vertically mounted in slots or grooves in the walls of such containers. Examples of such types of protective carriers which have evolved include those shown and described in U.S. Pat. Nos. 4,211,324 to Ohlbach; 4,404,615 to Dep; 4,426,675 to Robinson et al; 4,427,114 to Howell et al; and 4,480,747 to Kazor et al.

None of the approaches set forth above are completely satisfactory for one reason or another. For example, none of the approaches permit a printed circuit board to be stored before the components are soldered in place (not mounted in a horizontal plane); none of the approaches permit drying and testing while the printed circuit boards are maintained within the container; and none of the approaches permit easy access to printed circuit boards maintained in stacked carriers. Further, none of the approaches known to the applicants have been designed for loading and unloading of printed circuit boards into the carriers by simple robotic motion. In short, each of the approaches known to the applicant are limited for use either as shipping containers or as temporary storage containers, and require repeated removal and replacement, of the printed circuit board. Each removal breaks the Faraday Cage, and thus requires reestablishment thereof and protection while out of the container.

SUMMARY OF THE PRESENT INVENTION

The present invention, on the other hand, is directed to a multi-use container or carrier which will overcome all of the aforementioned problems. In the protective container according to the present invention, the following features are incorporated:

1. The container provides continuous electrostatic discharge protection for each individual board from the time of the component assembly operation to the time the board is installed into a computer.

2. The container is constructed from an impact resistant, carbon filled polypropylene material which provides superior protection from physical damage to both the module and to the printed circuit board.

3. The same container in which the printed circuit board is initially placed becomes the shipping and/or field service container singly or in multiples with a minimum of additional packaging.

4. Printed circuit boards are suspended horizontally between the upper and lower walls of the container which allows for drop-in components to be assembled and held in storage prior to the soldering operation.

5. The combination of the horizontal suspension and a hinged front wall permit indexing and possible adaption to robotic techniques.

6. Individual containers or modules interlock and/or stack without locking with other containers to make multiple units.

7. Adjustable vertical partitions, between which printed circuit boards are suspended or emplaced in selected tracks in the top and bottom wall of the module permit the same module to be used for various widths of printed circuit boards.

8. The partitions carry adjustable stops thereon which provide a rear stop for various lengths of printed circuit boards.

9. The top and bottom walls of the modules may be disconnected and connected by additional side inserts to provide for printed circuit boards with higher components.

10. Drying, testing and "burn-in" of the assembled printed circuit boards may be achieved without removing the boards from the modules, thereby maintaining the Faraday Cage during such operations.

In general, the present invention is directed to an electrostatic dissipative storage and shipping container formed from a rectangular tube open at the front and rear and having a top, bottom and side walls. A plurality of parallel tracks in the top and bottom walls extend in a direction from front to rear thereof and support at least one pair of upstanding longitudinally extending partitions mounted in horizontally spaced relation therein. The partitions are formed with opposed longitudinal channels in the upstanding wall thereof between which the printed circuit boards are suspended in such a manner that the components and terminal leads thereof do not engage either the top wall or bottom wall of the container. A hinged door selectively movable between an open and closed position is attached at both the front and rear of the rectangular tube. At least the U-shaped halves, and preferably the doors as well, are formed of a conductive polymeric material.

Preferably the rectangular tube comprises a pair of identical, U-shaped halves placed together with one of the halves being inverted. The top and bottom halves releasably snap together to form the rectangular tube. Even with the front and rear door opened, the top and bottom halves maintain an 85% coverage of the printed circuit board to maintain an effective Faraday Cage. The front and rear doors releasably snap into place for easy assembly and removal and include a stop thereon to ensure no greater than a 90° opening.

The top and bottom walls include complementary nesting feet and pads for facilitating stacking of the modules. A surface rib structure on the top and bottom walls mate with the adjacent unit when stacked to provide a rib-to-rib bearing surface. Locking means are provided for the stacked modules, and both the locking tabs and the snap-lock which secures the top and bottom walls together are set into the plane of the side walls so that no protrusions extend therefrom.

The tracks in the top and bottom wall are non-continuous to facilitate emplacement of the partitions without binding. However, the channels in the partition wall are continuous, with the exception of flared front and rear ends, to provide support for substantially the entire length of the side edges of the printed circuit board. The vertical center line of the partition is offset from the corresponding center line of the supporting track, and this feature combined with the channels on either side of the partition wall permit incremental adjustment for different board widths. Further, the distance from the channels on the side to one longitudinal edge of the partition is greater than the distance between the channel and the opposite edge, whereby when the partition is inverted 180°, greater clearance for components mounted on the printed circuit boards may be provided either above or below the board. The partitions are ribbed along the top and bottom edge by means of numbered ribs and, when an elastic O-ring or spring is inserted in the proper ribs, a back stop for the rear edge for the printed circuit board is provided, so that the board is prevented from shifting from front to rear during storage or shipping.

Finally, the top and bottom walls are assembled with a quickly releasable catch means, and when disconnected, inserts may be emplaced therebetween to provide for a module of a different height dimension. This feature, combined with the replacement of the regular size door with a larger door, further provides for standardization of parts.

It is therefore a primary object of the present invention to provide an improved protective storage and shipping container or module for printed circuit boards.

It is another object of the invention to provide a container for printed circuit boards of the type described formed of a small number of standardized parts, but which is adapted to receive various sizes of printed circuit boards.

It is yet another object of the present invention to provide a container of the type described in which printed circuit boards may be retained for longer periods of time without removal or transfer.

Another object of the present invention is to provide a container of the type described in which the printed circuit boards are mounted horizontally in such a manner that the components on the printed circuit board do not engage either the upper or lower walls thereof.

Yet another object of the present invention is to provide a container of the type described which can be satisfactorily stacked above or below other similar containers to make multiple tier storage units.

Yet another object of the present invention is to provide a container of the type described in which the same basic body member serves as both the top or bottom half, which substantially reduces the number of parts to be formed.

Other objects and a fuller understanding of the invention will become apparent from reading the following detailed description of a preferred embodiment along with the accompanying drawings in which:

FIG. 1 is a perspective view illustrative of the container according to the present invention;

FIG. 1A is an exploded sectional view taken substantially alng lines 1A—1A in FIG. 1 and illustrating the side wall configuration;

FIG. 2 is an enlarged perspective view, with parts broken away, illustrating a portion of the bottom wall of the container with a partition partially inserted therein;

FIG. 2A is a sectional view taken substantially along lines 2A—2A of FIG. 2 and illustrating the cross-sectional configuration of one of the partitions mounted between the top and bottom wall;

FIG. 5 is a perspective view illustrating a portion of one of the doors removed from the container of the present invention;

FIG. 5A is a sectional view taken substantially along lines 5A—5A of FIG. 1 and illustrating the relationship of the front door to the front end of the container.

DETAILED DESCRIPTION OF A PREFERRED EMBODIMENT

Figure 6:
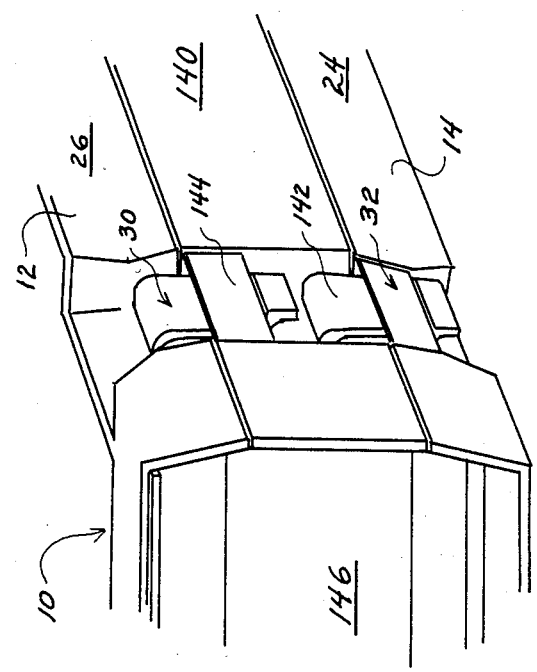
FIG. 6 is a perspective view similar to FIG. 1, except showing an alternate embodiment in which the top and bottom halves of the container are separated by a removable insert.

Turning now to the drawings, there is illustrated a preferred embodiment of the protective container according to the present invention which includes generally a rectangular housing 10 initially open between the front and rear ends thereof to provide a tunnel therethrough. Housing 10 is selectively closable by front door 106 and an identical rear door (not shown). At least one pair of adjustable upstanding partitions 74,76 is slidably received within housing 10 and support the printed circuit boards in a horizontal position. The tunnel-shaped housing may be molded, extruded or otherwise formed, however, is preferably fabricated from two identical, U-shaped halves 12,14, one forming the top, and the other being inverted to form the bottom 14. Each half 12 or 14 includes a generally flat, rectangular planar member 22 and a pair of depending side walls 24,26. Side walls 24,26 diverge slightly from top to bottom to facilitate molding techniques. Further, the housing halves 12,14 are preferably formed of a carbon filled polypropylene material which is highly impact resistant and provides superior protection from physical damage to either the container itself or the printed circuit board within. The carbon filled polypropylene material from which halves 12,13 are formed provides a resistivity of $10^3$–$10^5$ ohms/square and, when a printed circuit board is emplaced therein, even with the doors 104 open, there results more than 85% coverage thereof.

Side walls 24,26 have associated with the terminal edges thereof, first of all, a plurality of tabs 28 extending outwardly from the rear surface thereof (see FIG. 1A). Thus, when the top and bottom halves 12,14 are assembled, the tabs 28 fit behind the wall of the adjacent housing half to prevent lateral movement therebetween. The tabs are so located along the edges of walls 24,26 that they do not interfere with each other when one housing half is inverted and assembled with the other housing half.

Figure 3:
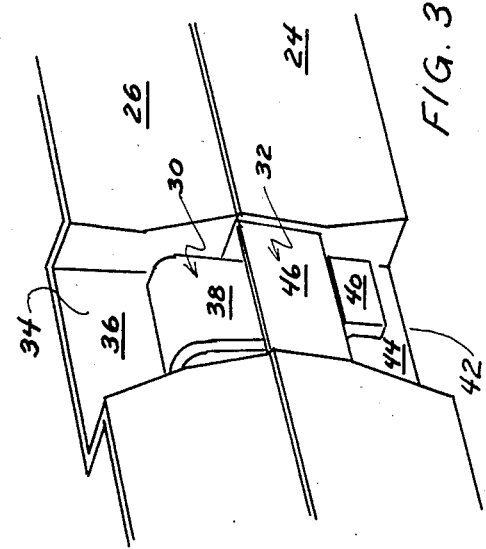
FIG. 3 is a perspective view illustrating a portion of one side of the container of FIG. 1 and showing the quickly releasable catch means which connects the top and bottom halves together.

As illustrated in FIG. 3 and in order to maintain the housing halves 12,14 in assembled position, there is provided a releasable catch means which includes locking means 30 along one edge of the housing half 20 and a complementary well or receiving means 32 along the other side edge thereof. Locking means 30 are formed in recesses 34 along side wall 26, which recesses 34 form an interior wall 36 from which an elongated tongue 38 depends. Tongue 38 terminates in a protrusion 40 at the lower extremity thereof. The receiving means 32 are fabricated in recesses 42 along the side wall 24. Recesses 42 form an inner wall 44 having an auxiliary or locking wall 46 spaced therefrom leaving an area therebetween for receiving the depending tongue 38. As the tongue 38 slides in between walls 44,46, the projection 40 is caused to snap in beneath the edge of wall 46, thereby securing the halves together.

Figure 4:
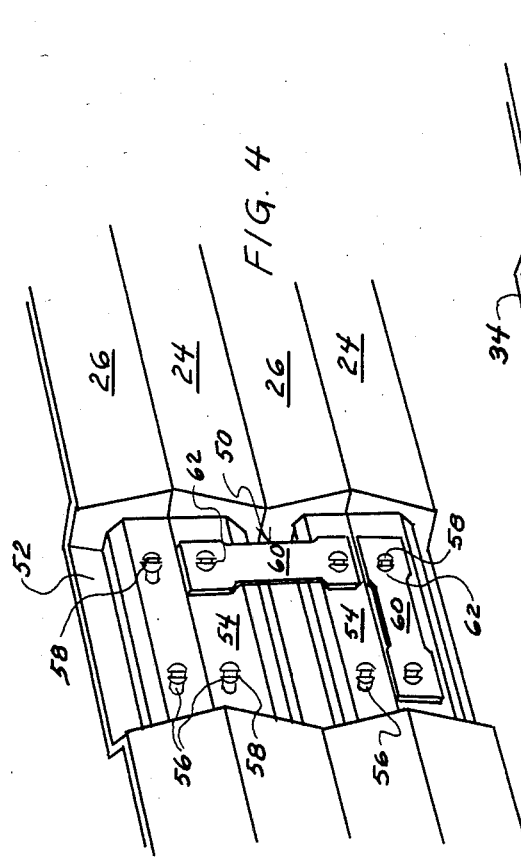
FIG. 4 is a perspective view illustrating a portion of one side of a pair of modules stacked one atop the other and the connecting straps which join one module to the other.

Module-to-module locking means 50 are provided along each side 24,26, again in recesses 52. Recesses 52 form a secondary wall 54 on which are mounted a plurality of buttons 56 having enlarged, grooved heads 58 therein. As best illustrated in FIG. 4, when two modules are stacked together, a pair of locking straps 60 having openings 62 therein snap over the buttons 56 on the bottom half of an upper unit and the corresponding buttons 56 on the top half of the adjacent underlying second module. The slots in the enlarged heads 58 allow the button heads 58 to be compressed sufficiently to be forced through opening 62, for assembly purposes in a conventional manner.

As has been stated hereinabove, the locking means 30,32 for both the upper and lower half and the module-to-module locking means 50 are formed within recesses 34,42,52 in side walls 24,26. The purpose of this recessed feature is to be able to slide the containers 10 easily into and out of storage racks without interference from any side projections. It has been found that such construction substantially avoids interference as the containers are emplaced and removed, and prevent perhaps damage of components therein resulting from vibrations created when a protrusion may catch on the side wall of the rack.

The upper surface of planar member 22 of each U-shaped half 12,14 is provided with a plurality of upstanding embossed ribs 64 in a crisscrossing pattern across the surface thereof. A pattern of upstanding cups 66 and feet or pads 68 nest together when modules are stacked. Looking at FIG. 1, it can be seen that the nesting cups 66 and feet 68 are provided in a complementary pattern across the planar surface 22 in such a manner that whe one half 12 is inverted and placed atop another half 14, the feet 68 will always be mated with a nesting cup 66. Further, when two modules are stacked together, as when the lower half of one module rests upon the upper half of another module, the feet 68 have a diameter of such size as to slide down within the nestng cups 66 of the opposed member, thereby causing the ribs 64 of one half 14 to engage and rest upon the ribs of the underlying half 12. This results in a sturdy, well supported stack of containers or modules 10.

The inner surface of the U-shaped bodies 20 are provided with a plurality of parallel tracks or grooves 70 extending generally from front to rear of the tunnel-shaped housing 10. As best illustrated in FIG. 2, grooves 70 are not continuous, but rather are divided ito a front section of grooves 70a and a rear sections of grooves 70b. The grooves 70 receive a pair of upstanding, horizontally spaced partitions 74,76 therein which partitions support the edges of printed circuit boards and mount them horizontally as will be explained hereinafter. The partitions 74,76, however, include front and rear tongue portions 78,80,82, and 84 along the top and bottom edges thereof. The tongues 78,80,82,84 are of a width dimension such that they slide within grooves 70 at the top and bottom halves 12,14. While the description hereinabove recites grooves 70 in the inner surface of body members 20 and tongues 78,80,82,84 protruding from partition 74,76, it is apparent that a reverse construction would operate equally well. In other words, the partitions 74,76 might include grooves in the upper and lower edges thereof, while the body member 20 could include tracks or rails on the upper and lower inner surfaces thereof.

As stated hereinabove, in the preferred embodiment as herein described, the grooves 70 are non-continuous, and the mating tongues in the upper and lower edges of partition 74,76 are non-continuous. Should a particular partition 74 or 76 be incorrectly inserted so that it was ultimately located with the front tongues 78,82 in one of grooves 70 and the rear tongues 80,84 offset therefrom in an adjacent groove, the situation can be easily remedied merely by pushing or pulling the partition on through the housing, placing the rear tongues 80,84 in the appropriate slot and sliding the partition back forwardly in the housing.

Turning now to a description of the partitions 74,76 themselves, it should be kept in mind that such partitions are identical, and therefore is only necessary to describe one partition in detail as such description will suffice for both. Each partition 74 includes an upstanding partition wall 92. At the ends of the front and rear portions of wall 92 are provided the aforementioned upper and lower tongues 78,80,82,84 which slide in grooves 70. The partitions 74,76 can be emplaced with either end serving as the front or rear, and can be inverted so that either edge may be the upper or lower edge.

A continuous channel 86 extends from the front to rear of partition 74 and is formed by flanges 85,87 which extend horizontally outwardly from the central wall 92 (see FIG. 2A). Channel 86 diverges at the front end as illustrated by element 90 and at the rear end as illustrated by element 88 to provide a lead in for the edges of the printed circuit boards to facilitate the emplacement therein. There is formed a similar channel 96 on the other side of the partitioned wall 92. The opposite channels 86,96 generally face each other, however, the distance from the longitudinal center line of channels 86,96 to the imaginary line formed by the outer extremity of tongues 82,84 is different than the distance from the center line of channels 86,96 to the imaginary line formed by the lowermost extremity of the lower tongues 78,80. This means that the center line of such channel 86 is offset from top to bottom of the partition 74. The partition 74 may be inverted to vary the clearance above and below the printed circuit board and the adjacent top or bottom wall as required by the design of the electrical components mounted on a selected printed circuit board.

As has been earlier described, the partitions 74,76 can be arranged in selected pair of grooves 70 in the top and bottom walls 12,14 of the housing. By moving the partitions further apart or closer together, the distance between the mounting channels 86,96 may be adjusted to support the side edges of printed circuit boards of varying widths. Even more incremental adjustment of the spacing between partitions 74,76 may be realized because of the fact that the positioning of channels 86,96 is assymetrical with respect to the longitudinal center line of wall 92. That is, the wall 94 separating channels 86,96 is not aligned with the center line of wall 92 connecting the tongues 78–84. Thus, when the partitions are arranged with the front tongues 78,82 of both partitions 74,76 in the front tracks 70a and the rear tongues 80,84 of partitions 74,76 in the rear tracks 70b, a first spacing between the facing channels partitions 74,76 is achieved. Naturally, by moving one of the partitions to the next groove, a different spacing is achieved, however, intermediate incremental spacings may be achieved by reversing one or both of the partitions 74,76 so that the front tongues 78,82 are in the rear grooves 70 and the rear tongues 80,84 are in the front grooves 70a.

A plurality of ribs or slots 98 extend along the upper and lower edges of partitions 74,76 in the area intermediate tongues 78–84. Such slots 98 are numbered from front to rear. A stretchable O-ring or spring 100 encircles the partition and may be placed in corresponding pairs of upper and lower slots 98 to provide a resilient back stop for a printed circuit board of a depth less than the entire distance between the front and rear doors. It is desirable that the printed circuit boards, when emplaced, be supported from the rear, as well as from the front. By placing the O-ring 100 in the appropriate slots 98, support for both the front and rear of the printed circuit board may be obtained between the O-rings 100 and the rear surface of the front door 106 to be described hereinafter.

Printed circuit boards are conventionally provided with ejectors along the front edge thereof, which are used to emplace the printed circuit boards in higher generation assemblies. To provide clearance for such ejectors, the front and rear of the partitions 74,76 are cut out at 102,104 respectively.

The housing 10 is further provided with front door 106 and an identical rear door. Since the doors are identical, a description of front door 106 will suffice as being illustrative of both. Each door 106 is a generally elongated rectangular member, preferably formed of the same conductive polymeric material as the top and bottom halves 12,14 are formed. A hinge means in the form of a projection 109 extends longitudinally from either end of the bottom side thereof, which projection 109 is received within a corresponding seat 110 in the bottom half 14 of the housing assembly 10. Since the bottom half 14 is identical to the top half 12, the top half will also have such a seat, however, it is unused. The seat is open at the upper end, so that the projection 109 may be snap fit thereinto when the door is removed or replaced. A pair of abutments 112 extending outwardly from the face of door 106 engage a ledge 114 along the outermost portion of the planar surface 22 to prevent the door 106 from opening more than 90°. The ledge 114 is formed because the door 106 is seated within the housing at a point spaced slightly from the front edge thereof, the ledge being formed by the distance of the planar member 22 between the door and the front edge.

Ledge 114 further includes a cutout 120 centrally located therein and an opening 122 adjacent cutout 120. This cutout and recess appear in both the top and bottom halves 12,14, however, for purposes of securing the door in the closed position, only the cutout 120 and opening 122 in the top half 12 are utilized. The door includes a cantilevered latch portion 116 which is secured to an upper flange 120. So arranged, as the spring latch 116 is depressed, the upstanding projection 118 is caused to be released from the opening 122 into which it snaps in the closed position. An abutment 124 is secured to the front surface of door 106 at a point slightly below the free end of latch 116 to facilitate manipulation and prevent overflexing of the latch, which could cause damage thereto.

Turning now to FIG. 6, there is illustrated an alternative embodiment in which the height of the housing 10 may be extended. For this purpose, the upper half 12 and lower half 14 are separated and specially formed inserts 140 are emplaced therebetween. Inserts 140 are of the same general construction on the upper and lower edges thereof as are the side walls 24,26 of the upper and lower halves, so that the upper and lower halves may be snapped into the inserts. For example, one edge of inserts 140 have a plurality of locking means 142, which correspond to locking means 30 on wall 26 of the upper and lower halves. Inserts 140 further include along the opposite edge thereof a plurality of receiving means 144 which correspond to the receiving means 32 on wall 24. Naturally, the doors 106 are replaced by doors 146 which are similar in construction except having a greater height dimension to cover the enlarged opening of the modified housing 10'. Although not illustrated the height dimension of partitions 74,76 would have to be increased. When the extenders 140 are used, the modules are stacked and locked together in the same manner as previously described.

In use, when a printed circuit board is first assembled with the electrical components loosely seated in the openings therein, the board is immediately placed into the protective container 10 and the Faraday Cage is established. From this point on it is necessary to protect sensitive components which could be damaged by static discharge at any time. The printed circuit boards may be stored in the containers of the present invention until it is time for the soldering operation, at which time the front door is opened, and the boards removed either manually or by robotics, from whence they are subjected to a soldering treatment, such as by wave or vapor soldering. Following such soldering treatment, the boards are returned to their protective cases. The drying operation may be performed with the boards in their protective cases and protected by the Faraday Cage by opening the front and rear doors and allowing the drying air currents to pass therethrough. The boards may also be tested and the circuits "burned in" while in the containers 10 by opening the rear door, whereupon access to the terminal strip along the rear edge of the circuit board is obtained. The doors are closed, and the containers are ready for shipment to the field or for storage until ready for assembly into a higher generation component.

As a result of the use of the containers according to the present invention substantially continuous protection from electrostatic discharge is provided for the sensitive components on each individual printed circuit board from the time the components are first assembled thereon until eventual installation into a computer or other electronic device. The carbon filled polypropylene material from which the housing, doors, and partitions are formed provides resistivity of $10_3$ to $10_5$ ohms/square and maintains the protection over more than 85% of the area within in the embodiment illustrated in FIGS. 1-5, even during times when the doors are open. The same container or module which is used for handling during manufacturing operations may be further used for shipping or field servicing containers singly or in multiples, thereby reducing or minimizing additional packaging. The horizontal positioning of the printed circuit boards not only allows for drop in components to be positioned and held in storage prior to the soldering operation, but also permits indexing and possible adaptation to robotics. Individual modules interlock with other modules to make multiple units, or can stack without locking. The adjustable partitions allow for various width boards, and additional partitions may be utilized to hold multiples of smaller boards within the same container.

The adjustable partitions provide for adjustment to support printed circuit boards of varying widths, and the construction of the partitions enables intermediate incremental adjustments of the partitions within each set of grooves 70 in the top and bottom halves.

While a preferred embodiment of the invention has been described in detail hereinabove, it is obvious that various changes and modifications might be made without departing from the scope of the invention. For example, while carbon filled polypropylene is the desired material, there are other conductive polymers which could be substituted. While fabrication of identical halves which are assembled together to form a module is preferred, the tunnel shaped housing could be extruded or otherwise formed of non-identical halves. While hinged front and rear doors are preferred, one of the doors could be replaced with a solid wall. Other changes and modifications may come to mind, and the scope of the application should be determined solely by the claims set forth hereinbelow.

What is claimed is:

1. An electrostatic dissipative storage and shipping container for printed circuit boards containing sensitive micro-electronic components thereon, said container comprising:
   (a) a rectangular housing having a top, bottom and side walls with an opening therethrough from front to rear;
   (b) a plurality of tracks in said top and bottom walls extending in a direction from front to rear thereof;
   (c) at least one pair of upstanding longitudinally extending partitions mounted in horizontally spaced relation between corresponding tracks in said top and bottom walls;
   (d) said partitions having opposed longitudinal channels in the walls thereof between which are supported said printed circuit boards;
   (e) a hinged door selectively movable between an opened and closed position at least at the the front of said rectangular tube;
   (f) at least said housing being formed of a conductive polymeric material;
   (g) whereby said printed circuit boards are suspended without engagement of the type and bottom walls within a Faraday Cage.

2. The container according to claim 1 wherein said rectangular housing is formed of a pair of substantially U-shaped halves with one of said halves being inverted and the adjacent free edges of the opposed side legs being attached together.

3. The container according to claim 2 wherein said top and bottom halves are identical, thereby providing for standarized fabrication.

4. The container according to claim 2 and further including locking means to secure said top and bottom halves, said locking means including a plurality of depending tongues on one of said top and bottom walls which fit into corresponding recesses on the other of said top and bottom halves.

5. The container according to claim 1 wherein the corresponding dimensions of said container are such that with the front and rear doors thereof opened, there is realized at least an 85% coverage of the printed circuit board therein to maintain an effective Faraday Cage, whereby drying and testing of the printed circuit board may be effected with one or both doors opened without destroying the static discharge properties thereof.

6. The container according to claim 2 wherein said doors include a projection at either end thereof which snap into the adjacent side walls of said halves, whereby said doors are releasably retained therein.

7. The container according to claim 1 wherein said doors are provided with a stop means thereon which engages the adjacent top or bottom wall when opened to ensure that the door opens to no greater than a 90° angle, thus preventing interference with access to the module stacked above or below.

8. The container according to claim 1 wherein said doors are further provided with a spring latch means for securing said door in the closed position, thereby permitting rotation of the container during shipping or handling.

9. The container according to claim 2 wherein at least said top and bottom halves are formed from a carbon filled polypropylene material of such characteristics that there is provided a resistivity in the range of $10_3$–$10_5$ ohms/square.

10. The container according to claim 1 wherein said top and bottom walls are provided with protuberances and cups which intermesh at times when two containers are stacked one atop the other.

11. The container according to claim 10 and further wherein said top and bottom walls are provided with a rib structure across the surface thereof, said rib structure being of such dimensions that the ribs of the top wall of one unit engage and support the ribs of the bottom wall of the overlying unit when two units are stacked to provide a rib-to-rib bearing surface.

12. The container according to claim 1 and further including removable locking means connecting adjacent modules when stacked.

13. The container according to claims 4 and 11 wherein said locking means which secure the top and bottom walls together and said removable locking means which connects adjacent modules are arranged within the side walls of said container and do not protrude therebeyond.

14. The container according to claim 1 wherein said tracks in said top and bottom walls are non-continuous from front to rear, thereby facilitating insertion of said partitions within said top and bottom walls.

15. The container according to claim 1 wherein said channels in said partitions are substantially continuous from front to rear to provide upper and lower support for substantially the entire side edge of the printed circuit board during storage and shipping.

16. The container according to claim 15 wherein said channels diverge at the front and rear ends thereof to provide clearance for conventional ejectors on printed circuit boards as well as facilitating emplacement of the printed circuits within said channels.

17. The container according to claim 1 and further including channels on each side of said partition, and wherein the longitudinal center line of the wall portion of said partitions which separates said channels is offset from the longitudinal center line of the corresponding track into which said partition is mounted, whereby said partitions may be adjusted for different board widths.

18. The container according to claim 1 wherein the distance between the longitudinal centerline of said channel and the top of said partition is different than the distance between said channel and the bottom of said partition, whereby said partitions may be inverted to provide more or less clearance for components mounted on said printed circuit board.

19. The container according to claim 1 wherein each of said partitions include a plurality of ribs along at least the intermediate portion of the top and bottom edges thereof and a resilient O-ring for emplacement within said selected grooves to provide stop means for said printed circuit boards mounted in said partitions, whereby said printed circuit boards will only be inserted into said module a selected distance, depending upon the length of said printed circuit boards.

20. The container according to claim 19 wherein said ribs are provided with a numbered code for facilitating proper emplacement of said O-rings.

21. The container according to claim 2 and further including side wall inserts having attachment means associated therewith for emplacement between said top and bottom halves whereby said modules may be converted to modules with higher side walls for receiving printed circuit boards with higher components mounted thereon.

* * * * *